United States Patent
Tanaka et al.

(10) Patent No.: US 9,806,082 B2
(45) Date of Patent: Oct. 31, 2017

(54) SEMICONDUCTOR MEMORY DEVICE INCLUDING A SENSE AMPLIFIER ON A SEMICONDUCTOR SUBSTRATE, A MEMORY CELL INCLUDING A CAPACITOR AND A TRANSISTOR INCLUDING CONDUCTIVE LINES ELECTRICALLY CONNECTED TO THE SENSE AMPLIFIER

(71) Applicant: TOSHIBA MEMORY CORPORATION, Minato-ku (JP)

(72) Inventors: Chika Tanaka, Yokohama (JP); Keiji Ikeda, Kawasaki (JP); Yoshihiro Ueda, Yokohama (JP); Toshinori Numata, Kamakura (JP); Tsutomu Tezuka, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/266,798

(22) Filed: Sep. 15, 2016

(65) Prior Publication Data
US 2017/0271341 A1    Sep. 21, 2017

(30) Foreign Application Priority Data
Mar. 16, 2016    (JP) .................. 2016-052348

(51) Int. Cl.
*G11C 11/24* (2006.01)
*H01L 27/108* (2006.01)
(Continued)

(52) U.S. Cl.
CPC ...... *H01L 27/10897* (2013.01); *G11C 11/408* (2013.01); *G11C 11/4091* (2013.01);
(Continued)

(58) Field of Classification Search
CPC .... G11C 11/404; G11C 11/405; H01L 27/108
(Continued)

(56) References Cited

U.S. PATENT DOCUMENTS 8,884,340 B2    11/2014  Kim et al.
2007/0115229 A1  5/2007  Takatori et al.
(Continued)

FOREIGN PATENT DOCUMENTS

JP    2007-140310 A    6/2007
JP    2012-119048 A    6/2012
JP    2012-119048 A5   6/2012

OTHER PUBLICATIONS

Ki-Whan Song, et al. "A 31 ns Random Cycle VCAT-Based 4F2 DRAM With Manufacturability and Enhanced Cell Efficiency" IEEE Journal of Solid-State Circuits, vol. 45, No. 4, Apr. 2010, pp. 880-888.

*Primary Examiner* — Connie Yoha
(74) *Attorney, Agent, or Firm* — Oblon, McClelland, Maier & Neustadt, L.L.P.

(57) ABSTRACT

According to one embodiment, a semiconductor memory device includes a sense amplifier on a semiconductor substrate, a memory cell array including a memory cell above the sense amplifier, the memory cell including a capacitor and a first transistor, the capacitor including a first electrode and a second electrode, the first transistor including a first current path and a first control electrode controlling an on/off of the first current path, the first current path including a first terminal and a second terminal, the first terminal being electrically connected to the first electrode, and a first conductive line electrically connected to the second terminal and extending along an upper surface of the semiconductor substrate in a first direction, the first conductive line being electrically connected to the sense amplifier.

17 Claims, 18 Drawing Sheets

(51) Int. Cl.
*G11C 11/4091* (2006.01)
*H01L 29/24* (2006.01)
*H01L 29/78* (2006.01)
*G11C 11/408* (2006.01)
*H01L 27/06* (2006.01)
*G11C 11/404* (2006.01)
*G11C 11/405* (2006.01)

(52) U.S. Cl.
CPC ...... *H01L 27/0688* (2013.01); *H01L 27/1082* (2013.01); *H01L 27/10808* (2013.01); *H01L 29/24* (2013.01); *H01L 29/7827* (2013.01); *G11C 11/404* (2013.01); *G11C 11/405* (2013.01)

(58) Field of Classification Search
USPC .................. 365/149, 230.03, 185.21, 185.05
See application file for complete search history.

(56) References Cited

U.S. PATENT DOCUMENTS

| | | | |
|---|---|---|---|
| 2012/0063208 A1* | 3/2012 | Koyama | G11C 5/025 365/149 |
| 2012/0075917 A1 | 3/2012 | Takemura | |
| 2012/0299090 A1 | 11/2012 | Kim et al. | |
| 2013/0207170 A1* | 8/2013 | Kurokawa | H03K 19/17728 257/296 |
| 2016/0104521 A1* | 4/2016 | Onuki | G11C 11/4091 365/72 |

* cited by examiner

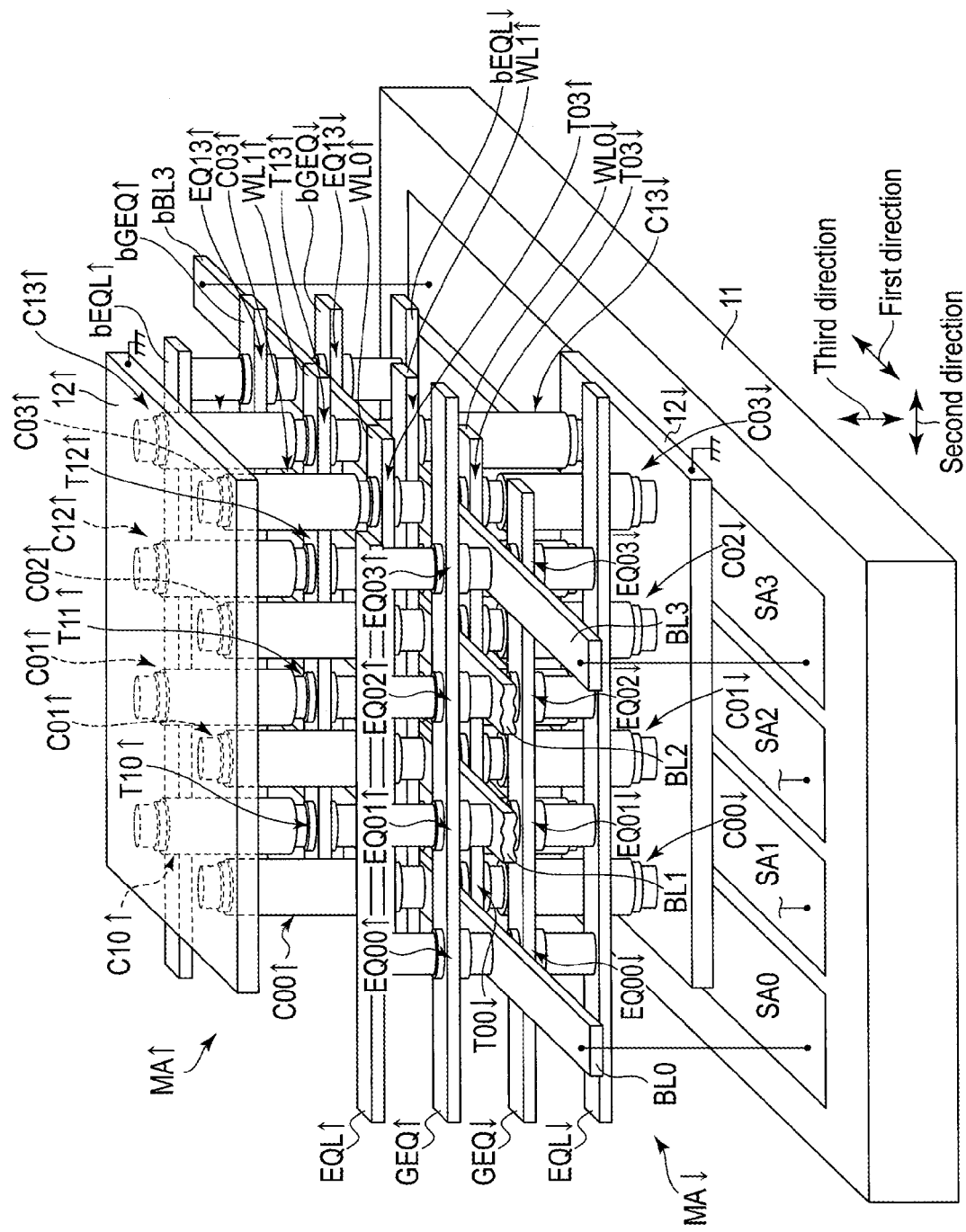
F I G. 1

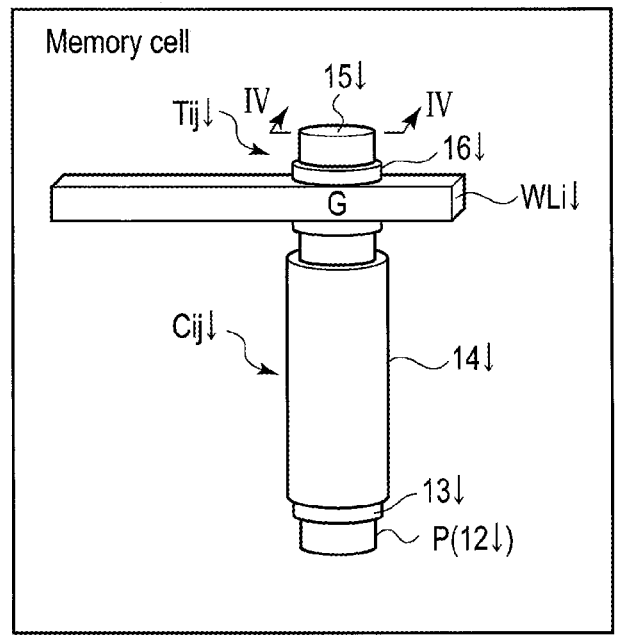
F I G. 3A
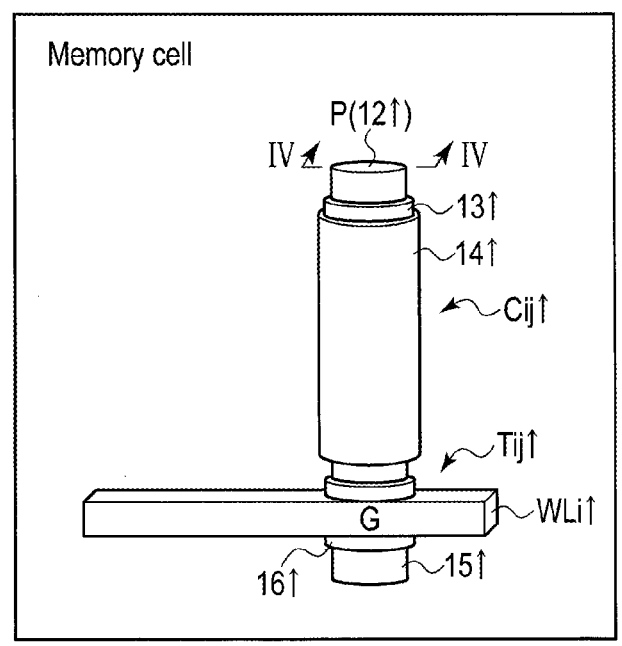
F I G. 3B

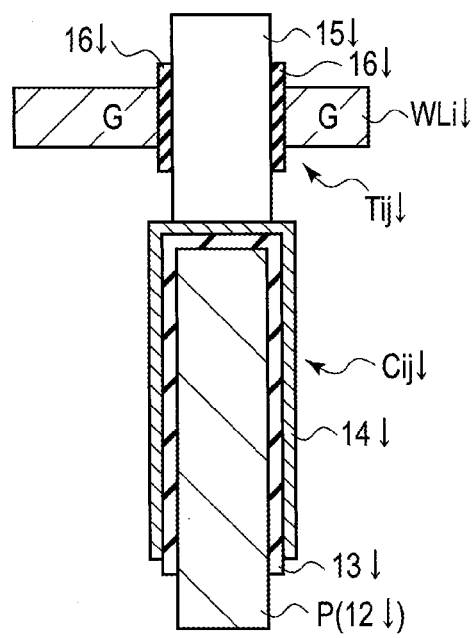
F I G. 4A
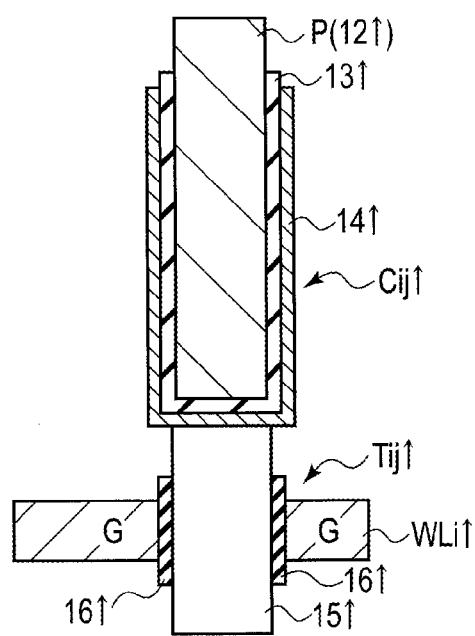
F I G. 4B

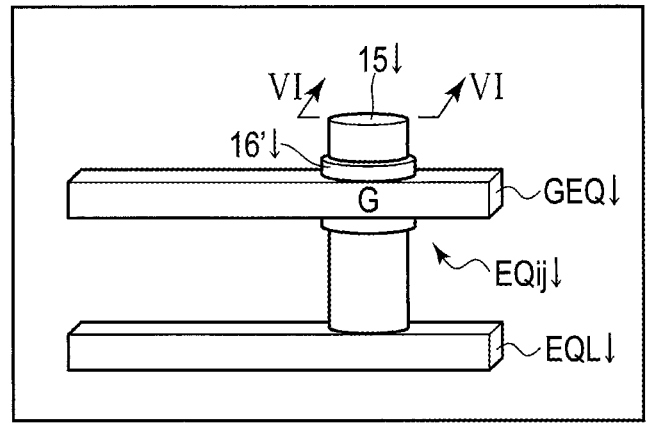
F I G. 5A
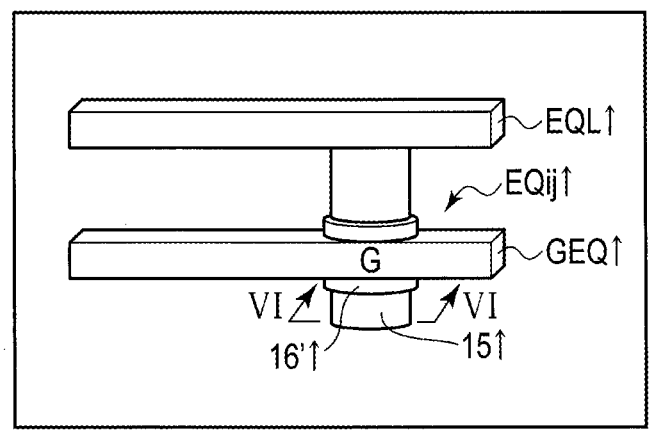
F I G. 5B

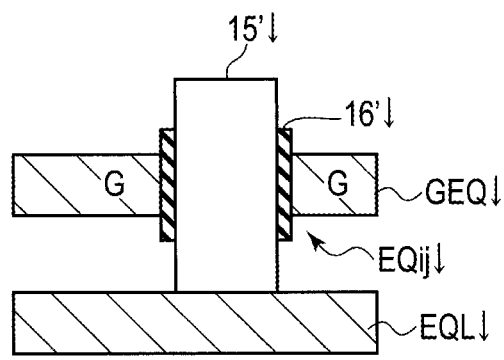
F I G. 6A
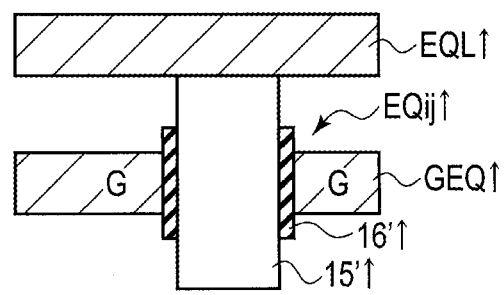
F I G. 6B

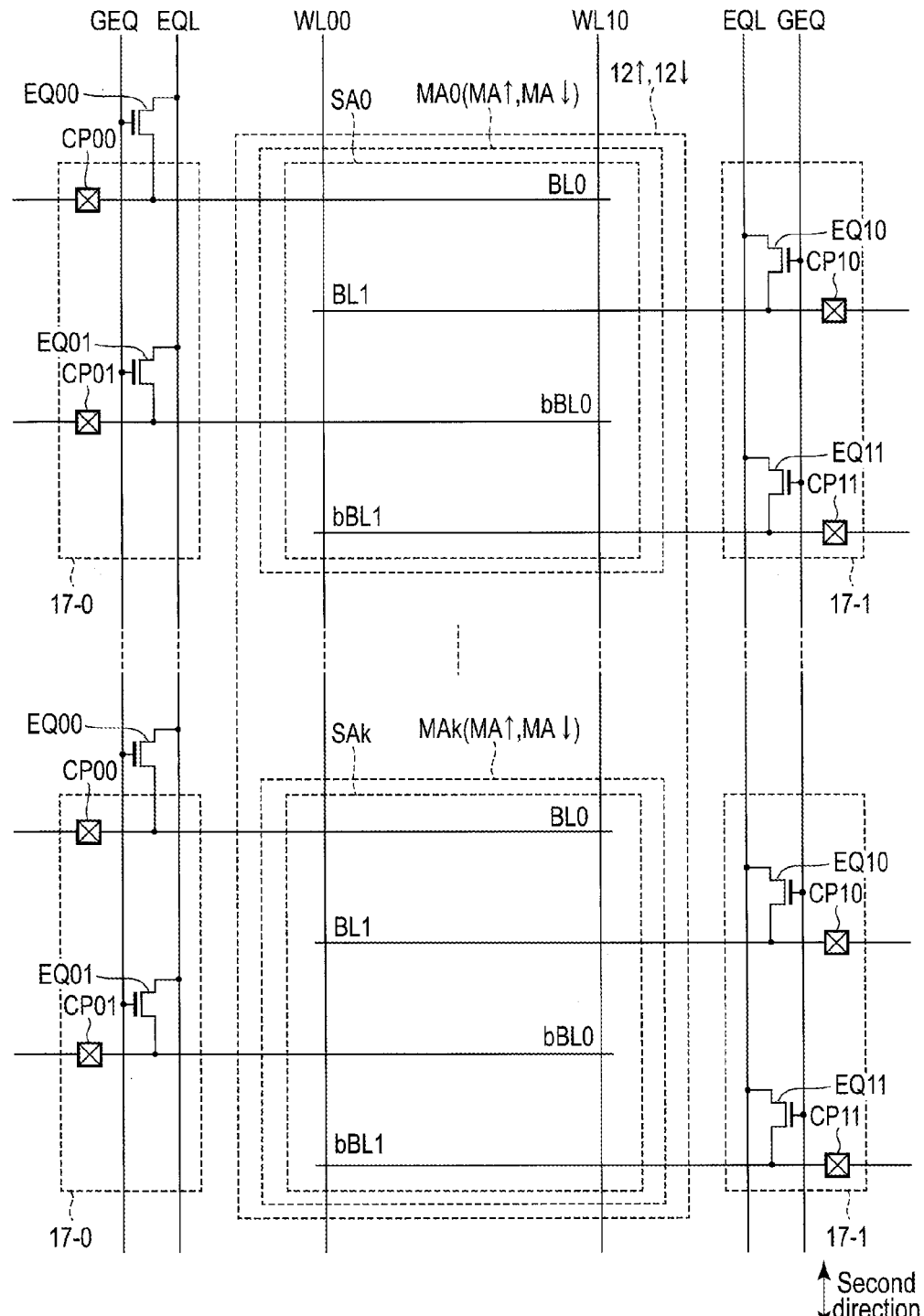
F I G. 12A

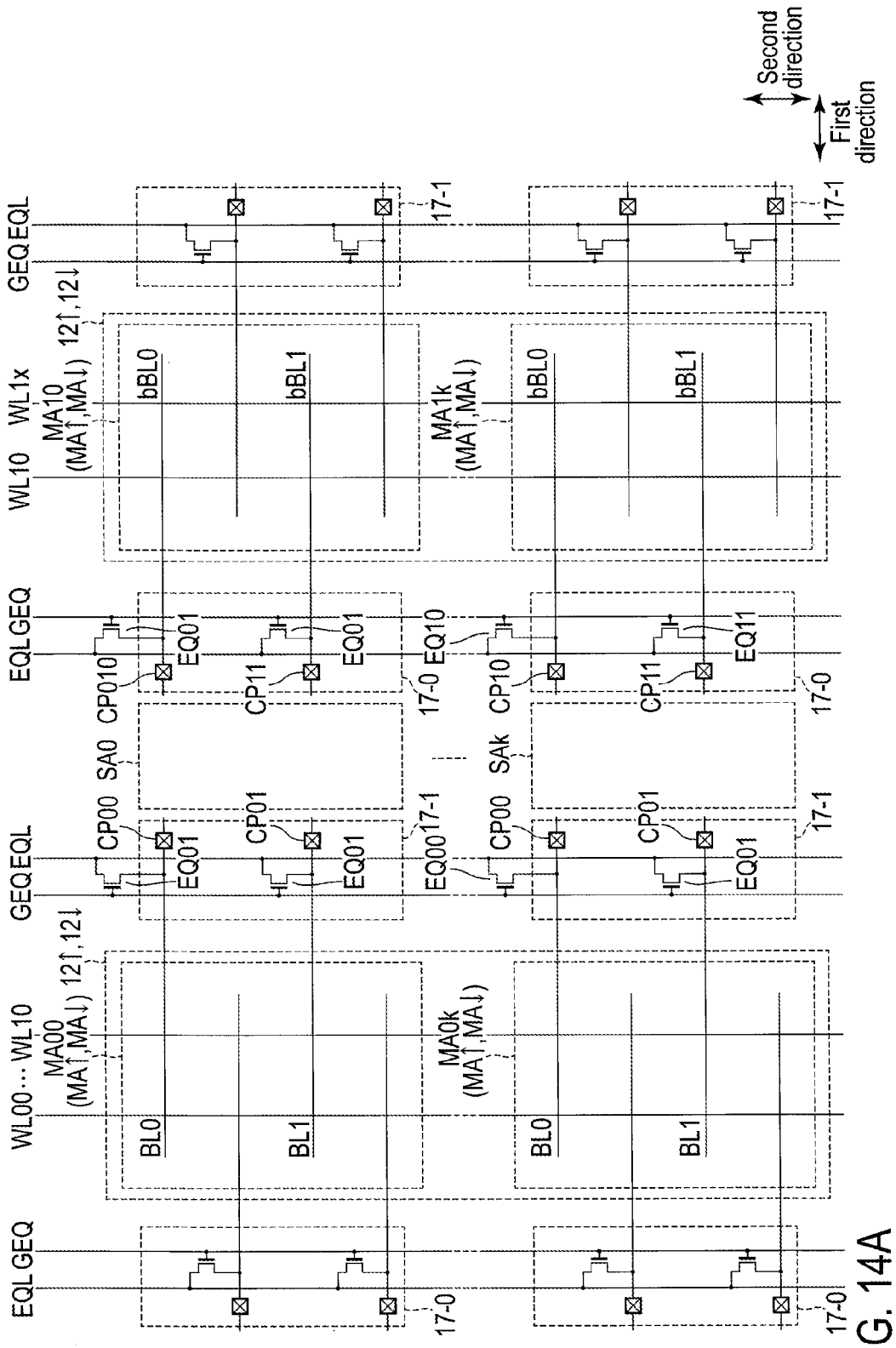
F I G. 14A

SEMICONDUCTOR MEMORY DEVICE INCLUDING A SENSE AMPLIFIER ON A SEMICONDUCTOR SUBSTRATE, A MEMORY CELL INCLUDING A CAPACITOR AND A TRANSISTOR INCLUDING CONDUCTIVE LINES ELECTRICALLY CONNECTED TO THE SENSE AMPLIFIER

CROSS-REFERENCE TO RELATED APPLICATIONS

This application is based upon and claims the benefit of priority from Japanese Patent Application No. 2016-052348, filed Mar. 16, 2016, the entire contents of which are incorporated herein by reference.

FIELD

Embodiments described herein relate generally to a semiconductor memory device.

BACKGROUND

A dynamic random access memory (DRAM) is used for various purposes such as the main memory of a system and a buffer. An increase in memory capacity of DRAM realizes a high-performance system but also causes an increase in cost. To solve the problem, technology to reduce the cost of the DRAM per bit by making memory cells of the DRAM three-dimensional is currently under consideration.

BRIEF DESCRIPTION OF THE DRAWINGS

FIG. 1 is a perspective view showing a first embodiment of memory cell arrays of a DRAM.
FIG. 3A and FIG. 3B are perspective views showing details of a capacitor and a select transistor.
FIG. 4A is a cross-sectional view seen along IV-IV of FIG. 3A.
FIG. 4B is a cross-sectional view seen along IV-IV of FIG. 3B.
FIG. 5A and FIG. 5B are perspective views showing details of an equalizing transistor.
FIG. 6A is a cross-sectional view seen along VI-VI of FIG. 5A.
FIG. 6B is a cross-sectional view seen along VI-VI of FIG. 5B.
FIG. 12A and FIG. 12B are circuit diagrams showing a second example of the layout of the bit line pairs.
FIG. 14A and FIG. 14B are circuit diagrams showing a fourth example of the layout of the bit line pairs.

DETAILED DESCRIPTION

In general, according to one embodiment, a semiconductor memory device comprises: a semiconductor substrate; a sense amplifier on the semiconductor substrate; a memory cell array including a memory cell above the sense amplifier, the memory cell including a capacitor and a first transistor, the capacitor including a first electrode and a second electrode, the first transistor including a first current path and a first control electrode controlling an on/off of the first current path, the first current path including a first terminal and a second terminal, the first terminal being electrically connected to the first electrode; a first conductive line electrically connected to the second terminal and extending along an upper surface of the semiconductor substrate in a first direction, the first conductive line being electrically connected to the sense amplifier; a second transistor including a second current path and a second control electrode controlling an on/off of the second current path, the second current path including a third terminal and a fourth terminal, and the third terminal being electrically connected to the first conductive line; and a second conductive line electrically connected to the fourth terminal. The first current path comprises a first semiconductor layer, and the second current path comprises a second semiconductor layer.

Embodiments will be hereinafter described with reference to the accompanying drawings.

EMBODIMENTS

Each memory cell of a DRAM comprises a select transistor (field-effect transistor [FET]) and a capacitor. It should be noted that making memory cells of a DRAM three-dimensional means disposing both the select transistor and the capacitor above the surface of a semiconductor substrate. That is, a DRAM in which a channel (current path) of the select transistor is the semiconductor substrate is not regarded as three-dimensional in the embodiments.

The embodiments are directed to a three-dimensional DRAM in which a channel of the select transistor is a semiconductor layer located above the surface of the semiconductor substrate. If the channel of the select transistor is located above the surface of the semiconductor substrate, for example, memory cells arrays can be stacked on the semiconductor substrate, which can increase memory capacity of the DRAM per chip and reduce the cost of the DRAM per bit.

First Embodiment

Figure 2:
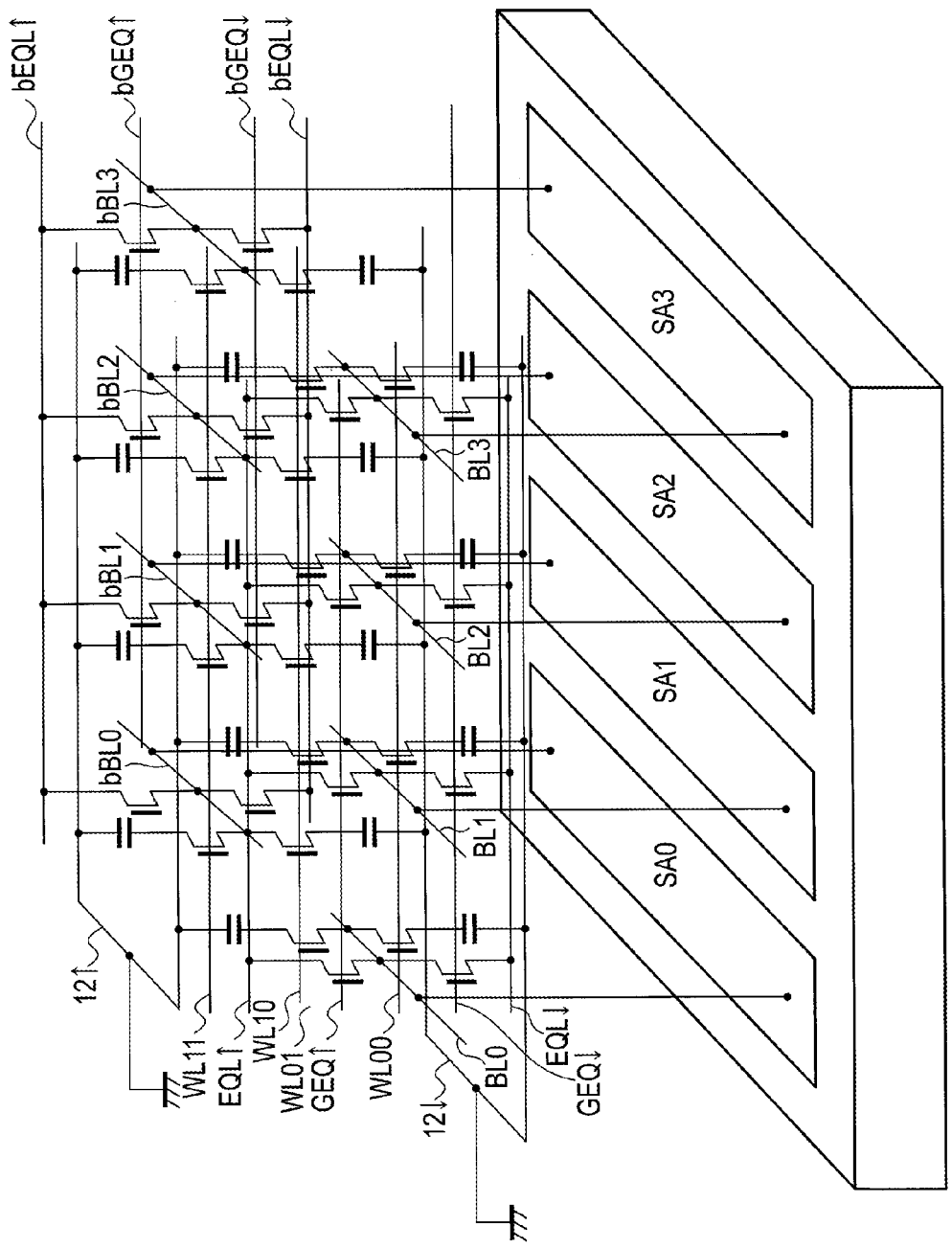
FIG. 2 is a circuit diagram showing an equivalent circuit of the device structure of FIG. 1.

FIG. 1 shows a first embodiment of memory cell arrays of a DRAM. FIG. 2 shows an equivalent circuit of the device structure of FIG. 1.

The first embodiment is an example of a structure in which two memory cell arrays $MA_\downarrow$ and $MA_\uparrow$ are stacked on a semiconductor substrate 11. However, any number of memory cell arrays may be stacked on the semiconductor substrate 11 provided that the number is $2^n$ (n=0, 1, 2, 3, . . . ). That is, one of two memory cell arrays $MA_\downarrow$ and $MA_\uparrow$ may be omitted. Otherwise, pairs of two memory cell arrays $MA_\downarrow$ and $MA_\uparrow$ may be stacked on the semiconductor substrate 11.

The semiconductor substrate 11 is, for example, a single crystal silicon layer. Peripheral circuits of the memory cell arrays are disposed in a surface region of the semiconductor substrate 11. The peripheral circuits are CMOS circuits for driving the memory cell arrays at the time of reading/writing. The peripheral circuits include an address decode circuit, a read circuit (including a sense amplifier), a write circuit and the like. In the present embodiment, sense amplifiers SA0, SA1, SA2 and SA3 are disposed in the surface region of the semiconductor substrate 11.

Sense amplifiers SA0, SA1, SA2 and SA3 as the peripheral circuits include transistors (P-channel and N-channel FETs) using the semiconductor substrate 11 as a channel (current path). The transistors are, for example, horizontal transistors having a channel parallel to the surface of the semiconductor substrate 11. However, the structure of the transistors in sense amplifiers SA0, SA1, SA2 and SA3 is not particularly limited.

Two memory cell arrays $MA_\downarrow$ and $MA_\uparrow$ are disposed above the surface of the semiconductor substrate 11, i.e., above the peripheral circuits such as sense amplifiers SA0, SA1, SA2 and SA3.

Memory cell array $MA_\downarrow$ includes word lines $WL0_\downarrow$ and $WL1_\downarrow$, bit lines BL0, BL1, BL2, BL3, bBL0, bBL1, bBL2 and bBL3 and memory cells $MC00_\downarrow$, $MC01_\downarrow$, $MC02_\downarrow$, $MC03_\downarrow$, $MC10_\downarrow$, $MC11_\downarrow$, $MC12_\downarrow$ and $MC13_\downarrow$. The number of word lines, the number of bit lines and the number of memory cells are not limited to this example.

Bit lines BL0, BL1, BL2, BL3, bBL0, bBL1, bBL2 and bBL3 extend in a first direction parallel to the surface of the semiconductor substrate 11. Word lines $WL0_\downarrow$ and $WL1_\downarrow$ extend in a second direction parallel to the surface of the semiconductor substrate 11 and crossing the first direction.

The present embodiment shows an example of a 2-cell/1-bit type in which one bit (complementary data) is stored in two memory cells $MC0j_\downarrow$ and $MC1j_\downarrow$. Accordingly, a pair of two bit lines BLj and bBLj is electrically connected to a sense amplifier SAj. Sense amplifier SAj senses read data based on the complementary data from two memory cells $MC0j_\downarrow$ and $MC1j_\downarrow$ (j is 0, 1, 2 or 3).

However, the present embodiment is not limited to the 2-cell/1-bit type. For example, the present embodiment is applicable to a 1-cell/1-bit type in which one bit is stored in one memory cell $MC0j_\downarrow$. In this case, for example, it is possible to omit word line $WL1_\downarrow$, bit lines bBL0, bBL1, bBL2 and bBL3 and memory cells $MC10_\downarrow$, $MC11_\downarrow$, $MC12_\downarrow$ and $MC13_\downarrow$. Sense amplifier SAj senses the read data by comparing a read potential based on memory cell $MCOj_\downarrow$ with a reference potential.

Memory cell $MCOj_\downarrow$ (j is 0, 1, 2 or 3) is electrically connected between a plate electrode $12_\downarrow$ and bit lines BL0, BL1, BL2 and BL3. Plate electrode $12_\downarrow$ is set to a fixed potential (for example, a ground potential). The present embodiment shows an example in which bit lines BL0, BL1, BL2 and BL3 are disposed above plate electrode $12_\downarrow$. However, plate electrode $12_\downarrow$ may be disposed above bit lines BL0, BL1, BL2 and BL3.

If bit lines BL0, BL1, BL2 and BL3 are disposed above plate electrode $12_\downarrow$, bit lines BL0, BL1, BL2 and BL3 can be shared by two memory cell arrays $MA_\downarrow$ and $MA_\uparrow$ as described later. If plate electrode $12_\downarrow$ is disposed above bit lines BL0, BL1, BL2 and BL3, two plate electrodes $12_\downarrow$ and $12_\uparrow$ can be integrated.

Memory cell $MCij_\downarrow$ (i is 0 or 1, j is 0, 1, 2 or 3) comprises a capacitor $Cij_\downarrow$ and a select transistor $Tij_\downarrow$. For example, as shown in FIG. 3A and FIG. 4A, capacitor $Cij_\downarrow$ comprises a pillar portion P as plate electrode $12_\downarrow$, an insulating portion $13_\downarrow$ covering the pillar portion P and a cell electrode portion $14_\downarrow$ covering insulating portion $13_\downarrow$. Select transistor $Tij_\downarrow$, comprises a semiconductor layer (semiconductor pillar) $15_\downarrow$ as a channel (current path), a gate insulating layer $16_\downarrow$ and a word line $WLi_\downarrow$.

Capacitor $Cij_\downarrow$ is a so-called fin capacitor. Capacitor $Cij_\downarrow$ is columnar, but the shape is not limited to this. Plate electrode $12_\downarrow$ and cell electrode portion $14_\downarrow$ are formed of a metal material such as aluminum, copper or tungsten. Insulating portion $13_\downarrow$ is formed of an oxide of a metal material such as aluminum, copper or tungsten.

Select transistor $Tij_\downarrow$ is, for example, a vertical transistor which comprises a semiconductor layer $15_\downarrow$ as a channel located above the semiconductor substrate 11 and crossing the surface of the semiconductor substrate 11. Semiconductor layer $15_\downarrow$ as a channel may be of any material provided it is independent of the semiconductor substrate 11. For example, semiconductor layer $15_\downarrow$ may be an epitaxial single crystal silicon layer, a polysilicon layer, an amorphous silicon layer or the like.

Semiconductor layer $15_\downarrow$ may also be an oxide semiconductor layer.

Currently, research results of a so-called oxide semiconductor thin-film transistor (TFT) excellent in off-state leakage characteristics (i.e., having a small leakage current in the off-state) are reported. The oxide semiconductor TFT has a feature in that an oxide semiconductor is used as a channel. For example, the oxide semiconductor is IGZO (InGaZnO) including indium oxide, gallium oxide and zinc oxide. The oxide semiconductor TFT is applicable to select transistor $Tij_\downarrow$ of the present embodiment.

The oxide semiconductor TFT can be formed by a low-temperature process of, for example, about 200° C., and thus does not impose thermal stress on the peripheral circuits in the surface region of the semiconductor substrate 11 in a wafer production process. In this regard, the oxide semiconductor TFT is quite effective at making a three-dimensional DRAM. In addition, a leakage current in the off-state can be greatly reduced by the oxide semiconductor TFT compared to a general silicon channel transistor.

Therefore, the use of the oxide semiconductor (for example, IGZO) as semiconductor layer $15_\downarrow$ can implement a DRAM having a very long data retention time.

For example, in the case of select transistor $Tij_\downarrow$ using silicon as a channel, a retention time is about 64 ms. Therefore, data should be frequently refreshed (rewritten). In contrast, in the case of select transistor $Tij_\downarrow$ using IGZO as a channel, a retention time is about 10 days. Therefore, data refresh does not affect system performance.

Semiconductor layer $15_\downarrow$ as a channel of select transistor $Tij_\downarrow$, is columnar in the present embodiment, but the shape is not limited to this. Gate insulating layer $16_\downarrow$ is formed of an insulator such as oxide silicon. Word line $WLi_\downarrow$ is formed of a metal material such as aluminum, copper or tungsten.

In memory cell array $MA_\downarrow$ of the present embodiment, one memory cell $MCij_\downarrow$ (i=0) is electrically connected to one bit line BLj (j is 0, 1, 2 or 3), and one memory cell $MCij_\downarrow$ (i=1) is electrically connected to one bit line bBLj (j is 0, 1, 2 or 3). This is to simplify the drawings and memory cells may be electrically connected to each of bit lines BLj and bBLj.

An equalizing transistor (FET) $EQij_\downarrow$ (i is 0 or 1, j is 0, 1, 2 or 3) is disposed at an end of memory cell array $MA_\downarrow$ in the first direction. For example, equalizing transistor $EQij_\downarrow$ (i=0) precharges bit line BLj to a predetermined potential (for example, Vdd/2) (Vdd is a power-supply potential) Vpre in preparation for reading. In the same manner, equalizing transistor $EQij_\downarrow$ (i=1) precharges bit line bBLj to predetermined potential Vpre in preparation for reading.

Equalizing transistor $EQij_\downarrow$ is called an equalizing transistor because it equalizes two bit lines BLj and bBLj to the predetermined potential in preparation for reading. In order to charge and discharge (i.e., equalize) bit lines BLj and bBLj at high speed, equalizing transistor $EQij_\downarrow$ should preferably be disposed near bit lines BLj and bBLj. This is because a parasitic capacitance can be reduced by disposing equalizing transistor $EQij_↓$ near bit lines BLj and bBLj.

However, equalizing transistor $EQij_↓$ of the DRAM is generally disposed in the surface region of the semiconductor substrate 11. In this case, a distance between equalizing transistor $EQij_↓$ and bit lines BLj and bBLj is increased, which makes it difficult to charge and discharge (i.e., equalize) bit lines BLj and bBLj at high speed.

Therefore, in the present embodiment, equalizing transistor $EQij_↓$ is disposed above the surface of the semiconductor substrate 11 in the same manner as memory cell $MCij_↓$.

For example, equalizing transistor $EQij_↓$ is disposed in the same layer as memory cell $MCij_↓$ (an area which is the same distance from the surface of the semiconductor substrate 11). The distance between equalizing transistor $EQij_↓$ and bit lines BLj and bBLj can be thereby reduced, which makes it possible to charge and discharge (i.e., equalize) bit lines BLj and bBLj at high speed.

Equalizing transistor $EQij_↓$ (i=0) is electrically connected between an equalizing potential line $EQL_↓$ having predetermined potential Vpre and bit lines BL0, BL1, BL2 and BL3. In the same manner, equalizing transistor $EQij_↓$ (i=1) is electrically connected between equalizing potential line $EQL_↓$ having predetermined potential Vpre and bit lines bBL0, bBL1, bBL2 and bBL3. Equalizing potential line $EQL_↓$ extends in the second direction.

For example, as shown in FIG. 5A and FIG. 6A, equalizing transistor $EQij_↓$ comprises a semiconductor layer (semiconductor pillar) $15'_↓$ as a channel (current path), a gate insulating layer $16'_↓$ and a gate equalizing line $GEQ_↓$. Gate equalizing line $GEQ_↓$ extends in the second direction.

Equalizing transistor $EQij_↓$ is a vertical transistor having a channel crossing the surface of the semiconductor substrate 11. Accordingly, a channel width of equalizing transistor $EQij_↓$ is in a circumferential direction of semiconductor layer $15'_↓$ and thus the driving force of equalizing transistor $EQij_↓$ can be increased. Since the driving force of equalizing transistor $EQij_↓$ is large, bit lines BL0, BL1, BL2, BL3, bBL0, bBL1, bBL2 and bBL3 can be charged and discharged (i.e., equalized) at higher speed.

In the same manner as semiconductor layer $15_↓$ of memory cell $MCij_↓$, semiconductor layer $15'_↓$ as a channel may be of any material provided it is independent of the semiconductor substrate 11. For example, semiconductor layer $15'_↓$ may be an oxide semiconductor layer (for example, IGZO). In this case, equalizing transistor $EQij_↓$ should preferably have the same structure as memory cell $MCij_↓$.

Semiconductor layer $15'_↓$ as a channel of equalizing transistor $EQij_↓$ is columnar in the present embodiment, but the shape is not limited to this. For example, gate insulating layer $16'_↓$ is formed of an insulator such as oxide silicon. For example, gate equalizing line $GEQ_↓$ is formed of a metal material such as aluminum, copper or tungsten.

Memory cell array $MA_↑$ is disposed on memory cell array $MA_↓$. In other words, two memory cell arrays $MA_↓$ and $MA_↑$ are stacked in a third direction crossing the first and second directions. The structure of memory cell array $MA_↑$ is symmetrical to the structure of memory cell array $MA_↓$ with respect to bit lines BL0, BL1, BL2, BL3, bBL0, bBL1, bBL2 and bBL3. In the present embodiment, bit lines BL0, BL1, BL2, BL3, bBL0, bBL1, bBL2 and bBL3 are shared by two memory cell arrays $MA_↓$ and $MA_□$.

Memory cell array $MA_↑$ includes word lines $WL0_↑$ and $WL1_↑$, bit lines BL0, BL1, BL2, BL3, bBL0, bBL1, bBL2 and bBL3 and memory cells $MC00_↑$, $MC01_↑$, $MC02_↑$, $MC03_↑$, $MC10_↑$, $MC11_↑$, $MC12_↑$ and $MC13_↑$. The number of word lines, the number of bit lines and the number of memory cells are not limited to this example.

Word lines $WL0_↑$ and $WL1_↓$ extend in the second direction. Memory cell array $MA_↑$ is of the 2-cell/1-bit type in the same manner as memory cell array $MA_↓$ as an example, but may be changed to the 1-cell/1-bit type. In this case, for example, word line $WL1_↑$, bit lines bBL0, bBL1, bBL2 and bBL3 and memory cells $MC10_↑$, $MC11_↑$, $MC12_↑$ and $MC13_↑$ can be omitted.

Memory cell $MC0j_↑$ (j is 0, 1, 2 or 3) is electrically connected between a plate electrode $12_↑$ and bit lines BL0, BL1, BL2 and BL3. Plate electrode 12T is set to a fixed potential (for example, a ground potential). Plate electrode $12_↑$ is disposed above bit lines BL0, BL1, BL2 and BL3, but bit lines BL0, BL1, BL2 and BL3 may be disposed above plate electrode $12_↑$.

Memory cell $MCij_↑$ (i is 0 or 1, j is 0, 1, 2 or 3) comprises a capacitor $Cij_↑$ and a select transistor $Tij_↑$. For example, as shown in FIG. 3B and FIG. 4B, capacitor $Cij_↑$ comprises a pillar portion P as plate electrode $12_↑$, an insulating portion $13_↑$ covering the pillar portion P and a cell electrode portion $14_↑$ covering insulating portion $13_↑$. Select transistor $Tij_↑$ comprises a semiconductor layer (semiconductor pillar) $15_↑$ as a channel, a gate insulating layer $16_↑$ and a word line $WLi_↑$.

Capacitor $Cij_↑$ is a so-called fin capacitor. Capacitor $Cij_↑$ is columnar, but the shape is not limited to this. For example, plate electrode $12_↑$ and cell electrode portion $14_↑$ are formed of a metal material such as aluminum, copper or tungsten. For example, insulating portion $13_↑$ is formed of an oxide of a metal material such as aluminum, copper or tungsten.

Select transistor $Tij_↑$ is, for example, a vertical transistor which comprises a semiconductor layer $15_↑$ as a channel located above the semiconductor substrate 11 and crossing the surface of the semiconductor substrate 11. Semiconductor layer $15_↑$ as a channel may be of any material provided it is independent of the semiconductor substrate 11.

Semiconductor layer $15_↑$ as a channel of select transistor $Tij_↑$ is columnar, but the shape is not limited to this. For example, gate insulating layer 16T is formed of an insulator such as oxide silicon. For example, word line $WLi_↑$ is formed of a metal material such as aluminum, copper or tungsten.

In memory cell array $MA_↑$, memory cells may be electrically connected to one bit line BLj or one bit line bBLj (j is 0, 1, 2 or 3).

An equalizing transistor (FET) $EQij_↑$ (i is 0 or 1, j is 0, 1, 2 or 3) is disposed at an end of memory cell array $MA_↑$ in the first direction. For example, equalizing transistor $EQij_↑$ (i=0) precharges bit line BLj to a predetermined potential (for example, Vdd/2) (Vdd is a power-supply potential) Vpre in preparation for reading. In the same manner, equalizing transistor $EQij_↑$ (i=1) precharges bit line bBLj to predetermined potential Vpre in preparation for reading.

The structure and the function of equalizing transistor $EQij_↑$ in memory cell array $MA_↑$ are the same as those of equalizing transistor $EQij_↓$ in memory cell array $MA_↓$. That is, equalizing transistor $EQij_↑$ (i=0) is electrically connected between an equalizing potential line $EQL_↑$ and bit lines BL0, BL1, BL2 and BL3. In the same manner, equalizing transistor $EQij_↑$ (i=1) is electrically connected between an equalizing potential line $EQL_↓$ and bit lines bBL0, bBL1, bBL2 and bBL3.

For example, as shown in FIG. 5B and FIG. 6B, equalizing transistor $EQij_↑$ comprises a semiconductor layer (semiconductor pillar) $15'_↑$ as a channel, a gate insulating layer $16'_↑$ and a gate equalizing line $GEQ_↑$. Equalizing transistor $EQij_\uparrow$ is a vertical transistor having a channel crossing the surface of the semiconductor substrate 11.

In the same manner as semiconductor layer $15_\uparrow$ of memory cell $MCij_\uparrow$, semiconductor layer $15'_\uparrow$ as a channel may be of any material provided it is independent of the semiconductor substrate 11. For example, semiconductor layer $15'_\uparrow$ may be an oxide semiconductor layer (for example, IGZO). In this case, equalizing transistor $EQij_\uparrow$ should preferably have the same structure as memory cell $MCij_\uparrow$.

Semiconductor layer $15'_\uparrow$ as a channel of equalizing transistor $EQij_\uparrow$ is columnar in the present embodiment, but the shape is not limited to this. For example, gate insulating layer $16'_\uparrow$ is formed of an insulator such as oxide silicon. For example, gate equalizing line $GEQ_\uparrow$ is formed of a metal material such as aluminum, copper or tungsten.

In the present embodiment, equalizing transistors $EQij_\downarrow$ and $EQij_\uparrow$ are electrically connected to the bottom and top of bit lines BL0, BL1, BL2, BL3, bBL0, bBL1, bBL2 and bBL3, respectively, but one of the equalizing transistors may be omitted.

For example, equalizing transistor $EQij_\downarrow$ may be omitted such that equalizing transistor $EQij_\uparrow$ is provided only on the memory cell array $MA_\uparrow$ side. Otherwise, equalizing transistor $EQij_\uparrow$ may be omitted such that equalizing transistor $EQij_\downarrow$ is provided only on the memory cell array $MA_\downarrow$ side. This is possible because bit lines BL0, BL1, BL2, BL3, bBL0, bBL1, bBL2 and bBL3 are shared by two memory cell arrays $MA_\downarrow$ and $MA_\uparrow$.

However, if equalizing transistors $EQij_\downarrow$ and $EQij_\uparrow$ are electrically connected to the bottom and top of bit lines BL0, BL1, BL2, BL3, bBL0, bBL1, bBL2 and bBL3, respectively, as in the present embodiment, the driving force of equalizing transistors $EQij_\downarrow$ and $EQij_\uparrow$ is increased, with the result that the speed of charge and discharge (i.e., equalization) of bit lines BL0, BL1, BL2, BL3, bBL0, bBL1, bBL2 and bBL3 can be further increased.

Figure 7:
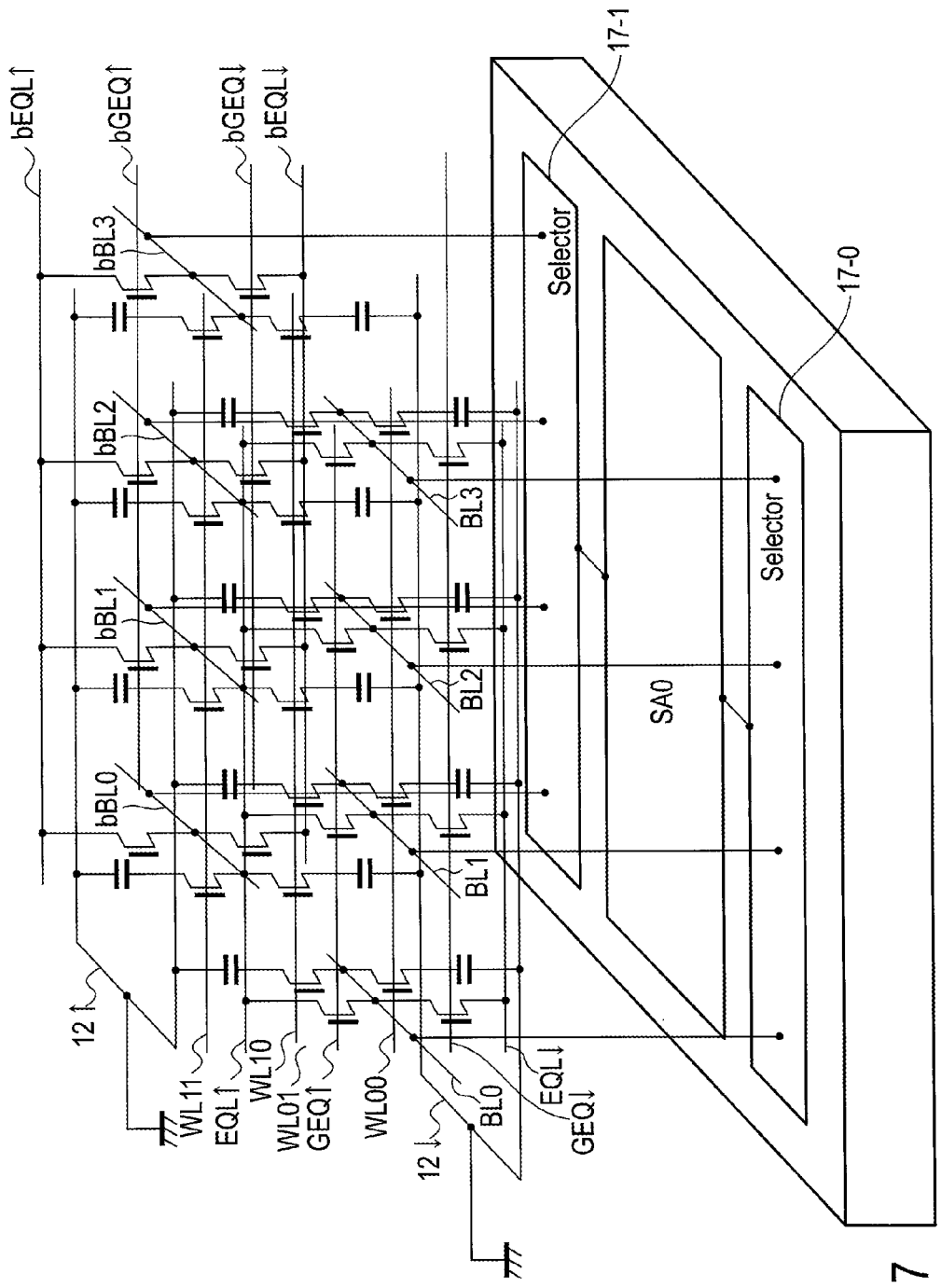
FIG. 7 is a circuit diagram showing a modified example of the first embodiment.

FIG. 7 shows a modified example of the first embodiment.

In the modified example, a selector 17-0 which selects one of bit lines BL0, BL1, BL2 and BL3 and a selector 17-1 which selects one of bit lines bBL0, bBL1, bBL2 and bBL3 are added.

Selectors 17-0 and 17-1 are disposed in the surface region of the semiconductor substrate 11. That is, selectors 17-0 and 17-1 as peripheral circuits comprise transistors (FETs) using the semiconductor substrate 11 as a channel in the same manner as sense amplifier SA0.

Since selectors 17-0 and 17-1 are added, it is only necessary to provide at least one sense amplifier SA0 for two memory cell arrays $MA_\downarrow$ and $MA_\uparrow$ in the modified example. In the modified example, any number of sense amplifiers may be provided as long as the number is less than the number of bit lines BL0, BL1, BL2 and BL3.

As described above, according to the first embodiment, in a three-dimensional DRAM in which select transistors of memory cells are disposed above a surface of a semiconductor substrate, a precharge time of bit lines, i.e., charge and discharge (equalization) of bit lines can be reduced and the speed of a read operation can be increased by disposing equalizing transistors in the same layer as the select transistors of the memory cells. As a result, the three-dimensional DRAM can be implemented.

Second Embodiment

Figure 8:
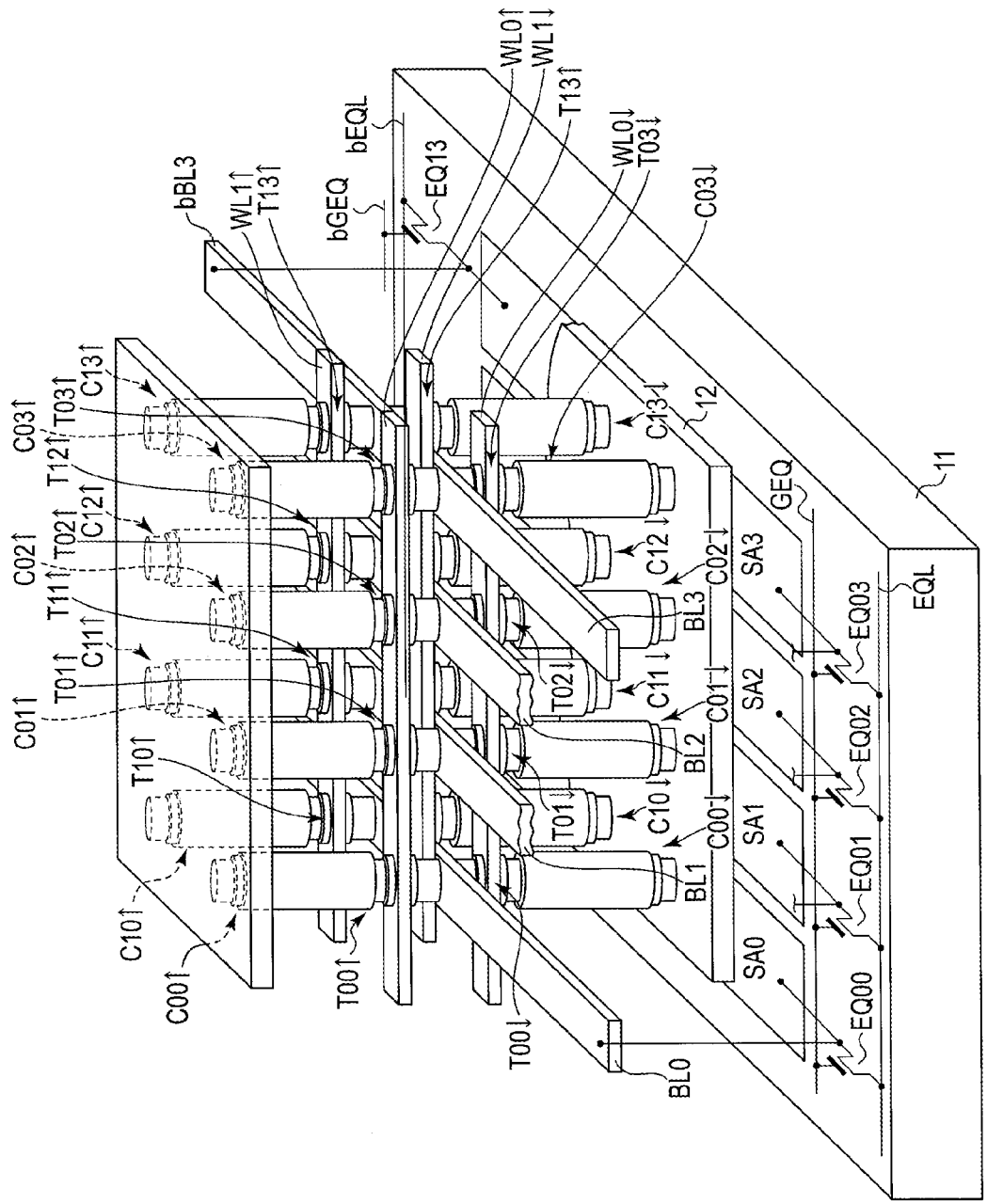
FIG. 8 is a perspective view showing a second embodiment of the memory cell arrays of the DRAM.
Figure 9:
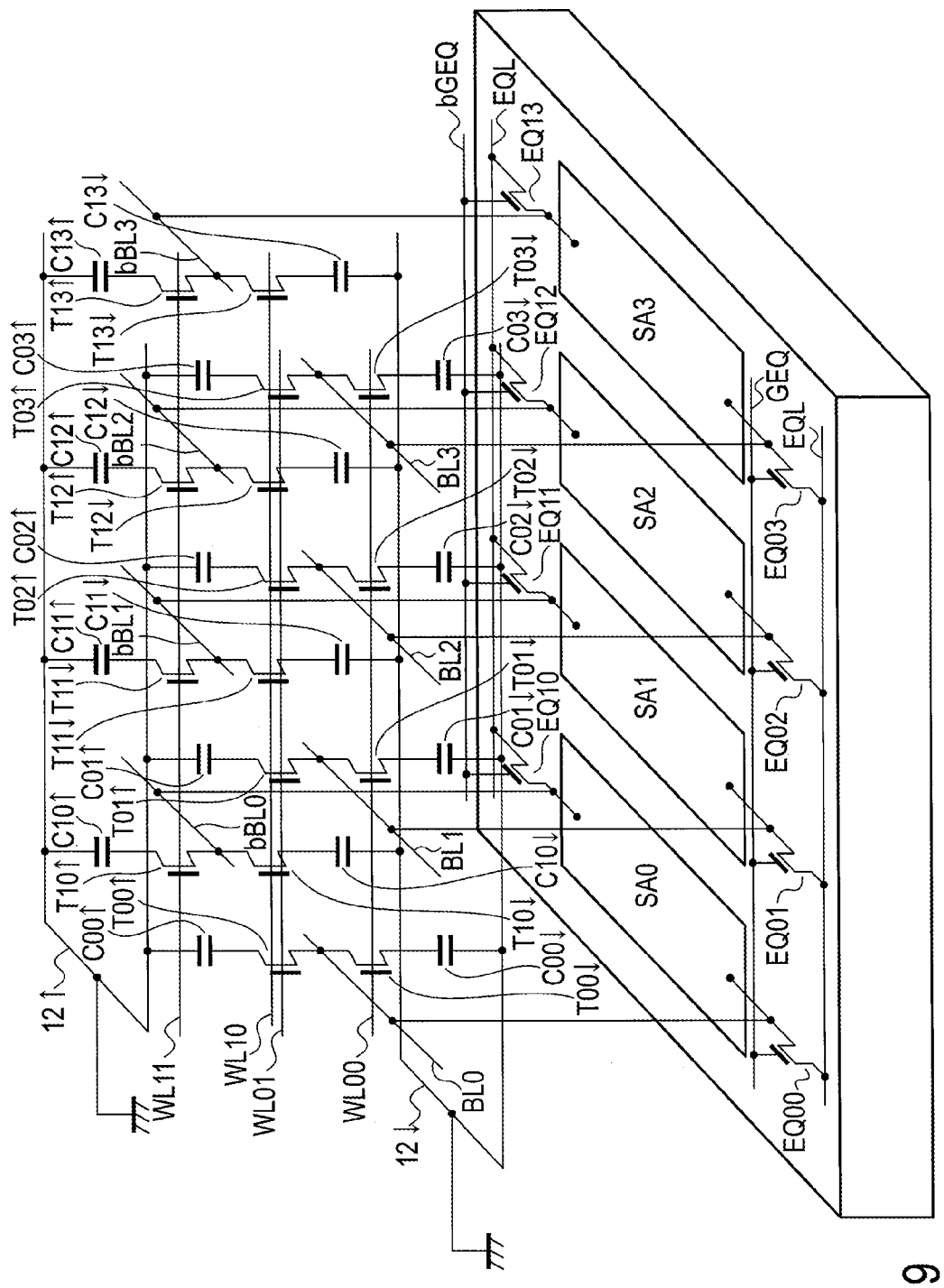
FIG. 9 is a circuit diagram showing an equivalent circuit of the device structure of FIG. 8.

FIG. 8 shows a second embodiment of the memory cell arrays of the DRAM. FIG. 9 shows an equivalent circuit of the device structure of FIG. 8.

Compared to the first embodiment, the second embodiment has a feature in a position of equalizing transistor EQij (i is 0 or 1, j is 0, 1, 2 or 3). The second embodiment is the same as the first embodiment except the above point. Thus, elements which are identical to those in FIG. 1 and FIG. 2 are denoted by the same reference numbers and the detailed explanation of such elements is omitted.

Equalizing transistor EQij (i=0) is electrically connected between an equalizing potential line EQL and bit lines BL0, BL1, BL2 and BL3. In the same manner, equalizing transistor EQij (i=1) is electrically connected between an equalizing potential line bEQL and bit lines bBL0, bBL1, bBL2 and bBL3.

Equalizing transistor EQij is disposed in the surface region of the semiconductor substrate 11. For example, equalizing transistor EQij is a horizontal transistor (FET) using the semiconductor substrate 11 as a channel. In this case, equalizing transistor EQij comprises a gate insulating layer on the semiconductor substrate 11 and a gate electrode (gate equalizing lines GEQ and bGEQ) on the gate insulating layer as in the case of a general FET. For example, gate equalizing lines GEQ and bGEQ extend in the second direction.

According to the second embodiment, equalizing transistors EQij are disposed in the surface region of the semiconductor substrate 11 together with sense amplifiers SA0, SA1, SA2 and SA3. In this case, too, a distance between equalizing transistors EQij and bit lines BL0, BL1, BL2, BL3, bBL0, bBL1, bBL2 and bBL3 can be reduced by disposing equalizing transistors EQij at ends of memory cell arrays $MA_\downarrow$ and $MA_\uparrow$ in the first direction. That is, the precharge time of bit lines BL0, BL1, BL2, BL3, bBL0, bBL1, bBL2 and bBL3 can be reduced and the speed of a read operation can be increased.

In order to reduce and uniformize a parasitic capacitance, interconnects connecting equalizing transistors EQij to bit lines BL0, BL1, BL2, BL3, bBL0, bBL1, bBL2 and bBL3 should preferably have the minimum and equal lengths.

Figure 10:
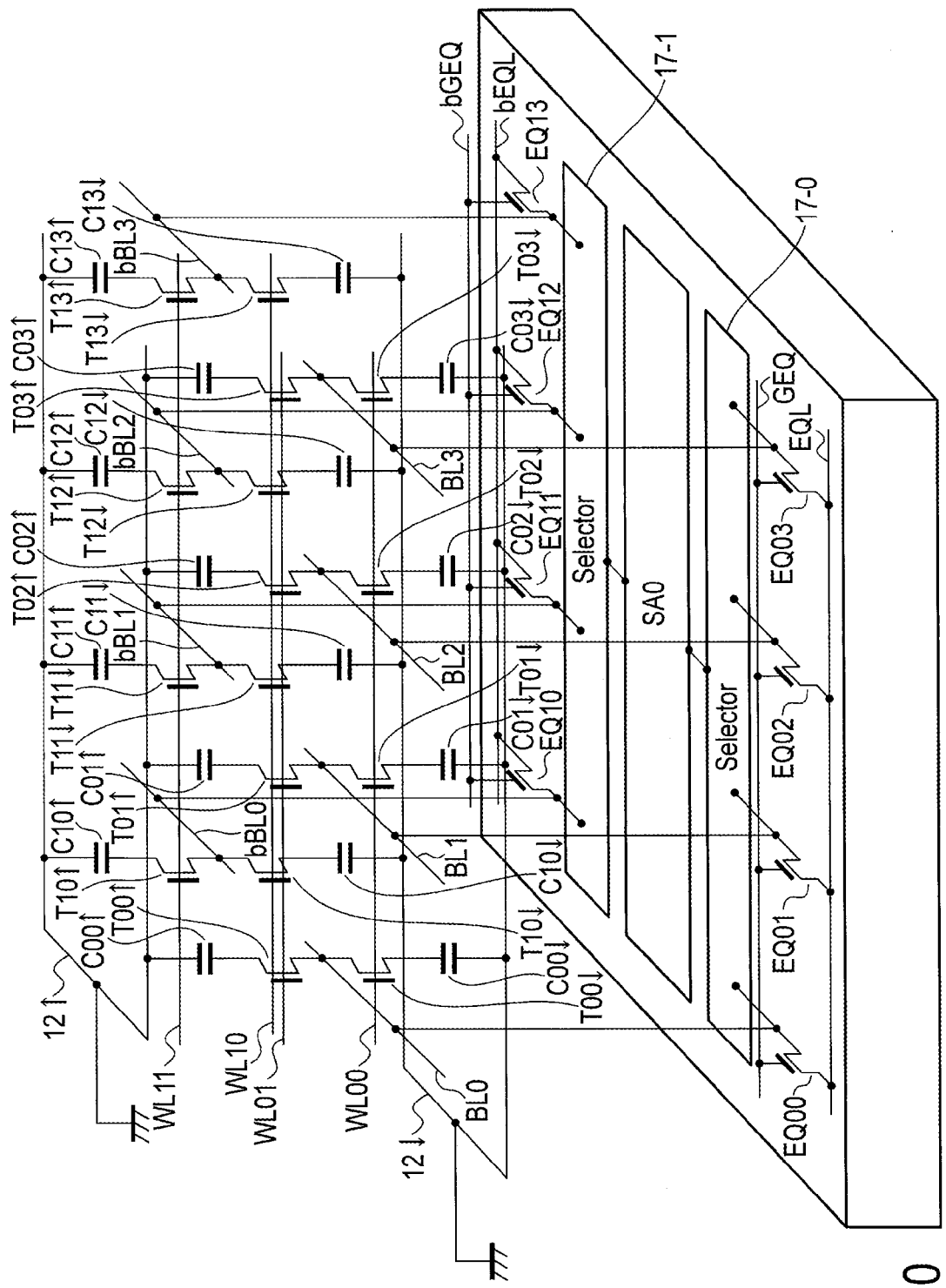
FIG. 10 is a circuit diagram showing a modified example of the second embodiment.

FIG. 10 shows a modified example of the second embodiment.

In the modified example, a selector 17-0 which selects one of bit lines BL0, BL1, BL2 and BL3 and a selector 17-1 which selects one of bit lines bBL0, bBL1, bBL2 and bBL3 are added.

Selectors 17-0 and 17-1 are disposed in the surface region of the semiconductor substrate 11. That is, selectors 17-0 and 17-1 as peripheral circuits comprise transistors (FETs) using the semiconductor substrate 11 as a channel in the same manner as equalizing transistor EQij and sense amplifier SA0.

Since selectors 17-0 and 17-1 are added, it is only necessary to provide at least one sense amplifier SA0 for two memory cell arrays $MA_\downarrow$ and $MA_\uparrow$ in the modified example. In the modified example, any number of sense amplifiers may be provided as long as the number is less than the number of bit lines BL0, BL1, BL2 and BL3.

As described above, in the second embodiment, too, in a three-dimensional DRAM in which select transistors of memory cells are disposed above a surface of a semiconductor substrate, a precharge time of bit lines can be reduced and the speed of a read operation can be increased by disposing equalizing transistors at the ends of memory cell arrays in the first direction (a direction of extension of bit lines) in the surface region of the semiconductor substrate. As a result, the three-dimensional DRAM can be implemented.

Third Embodiment

A third embodiment relates to a layout of pairs of bit lines BLj and bBLj in a 2-cell/1-bit sensing method. The third embodiment is applicable to the first and second embodiments. A layout of the pairs of bit lines BLj and bBLj most suitable for each generation of DRAM can be selected as appropriate. An example of a candidate for the layout of the pairs of bit lines BLj and bBLj is described below.

Figure 11A:
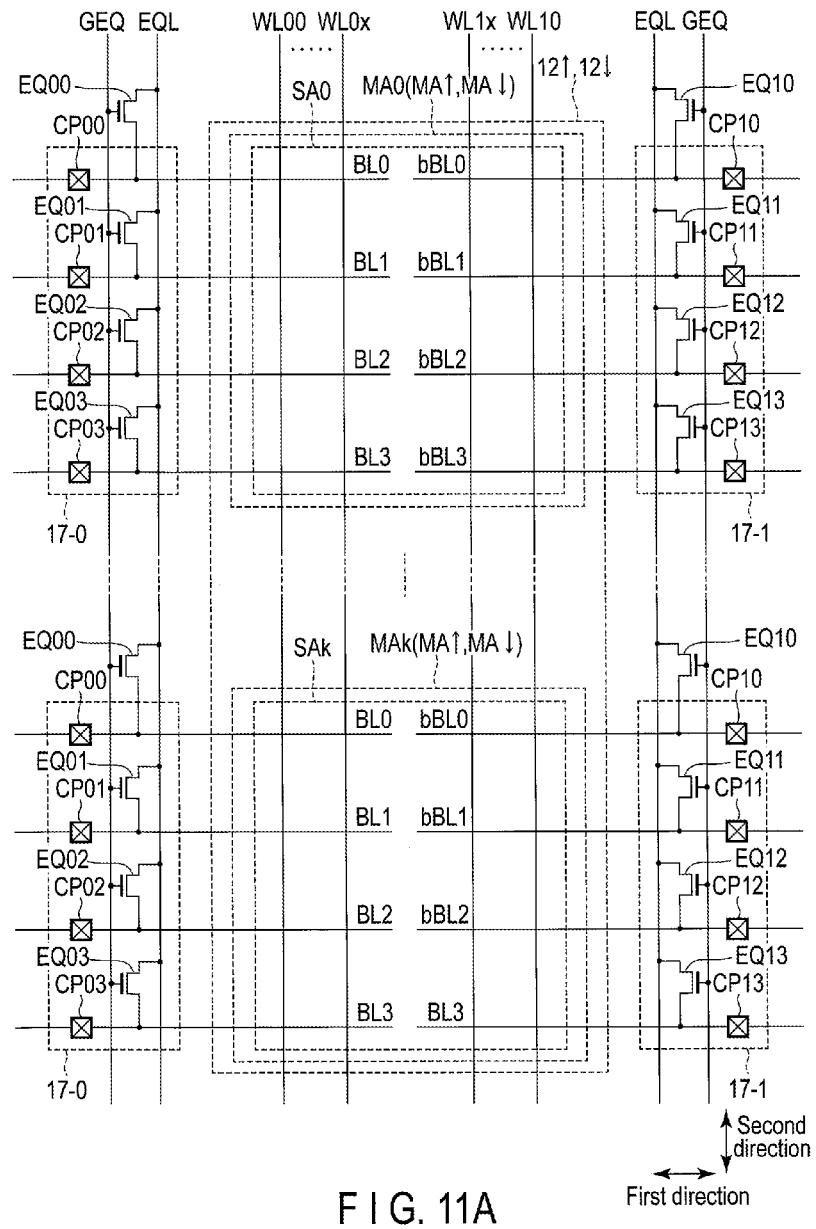
FIG. 11A and FIG. 11B are circuit diagrams showing a first example of a layout of bit line pairs.
Figure 11B:
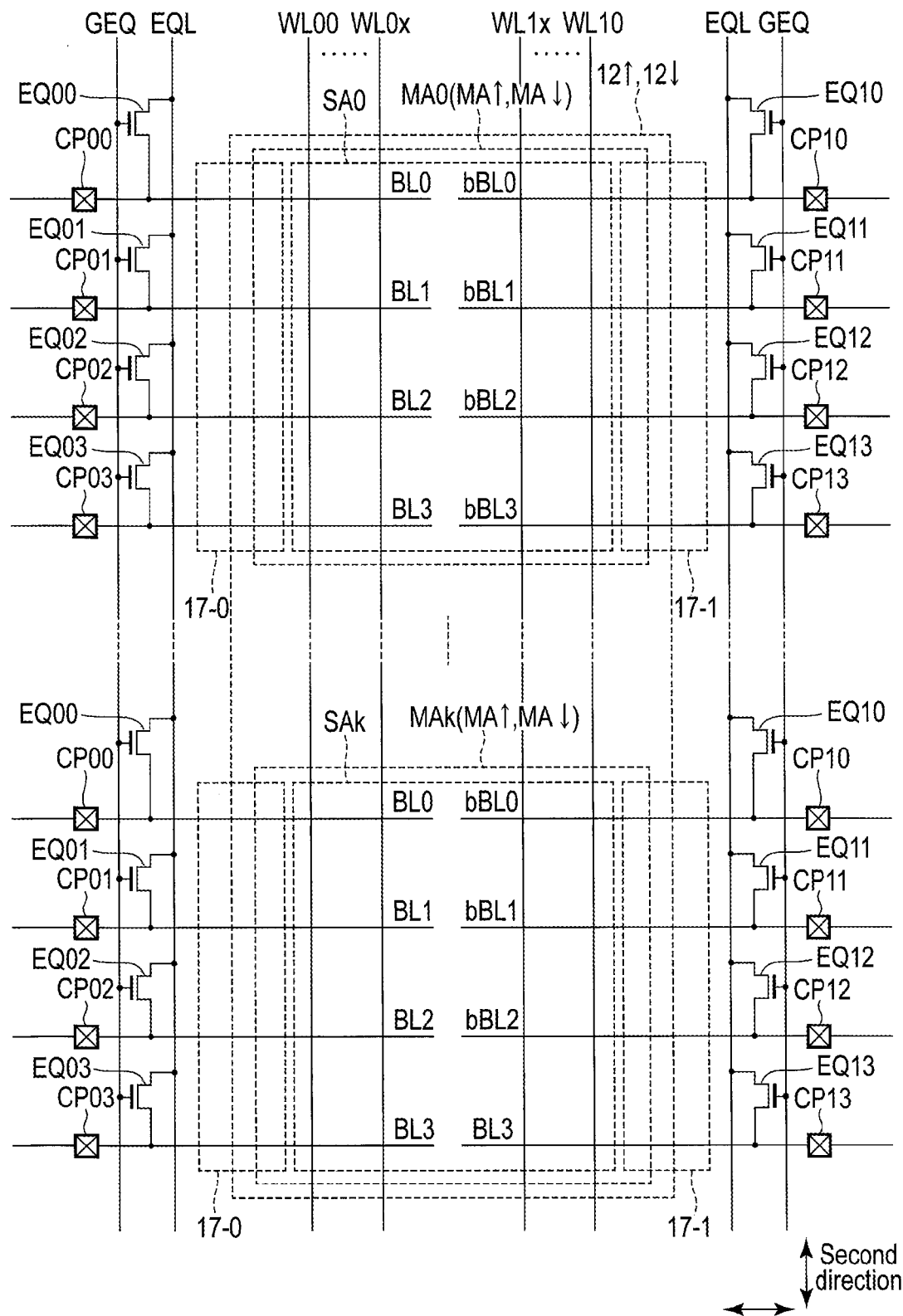

FIG. 11A and FIG. 11B show a first example of the layout of bit line pairs.

FIG. 11A shows a layout corresponding to the modified example of the first embodiment (FIG. 7). FIG. 11B shows a layout corresponding to the modified example of the second embodiment (FIG. 10).

Memory cell arrays MA0, . . . , MAk (k is a natural number not less than one) are disposed in the second direction. Each memory cell array MAm (m is one of 0 to k) comprises, for example, two memory cells $MA_\downarrow$ and $MA_\uparrow$ stacked on the semiconductor substrate.

For example, plate electrodes $12_\downarrow$ and $12_\uparrow$ can be shared by memory cell arrays MA0, . . . , MAk. However, plate electrodes $12_\downarrow$ and $12_\downarrow$ are not present below and above contact portions CPij (i is 0 or 1, j is 0, 1, 2 or 3) to secure the contact portions CPij.

A sense amplifier SAm (m is one of 0 to k) is disposed directly under memory cell array MAm. Selectors 17-0 and 17-1 are disposed near sense amplifier SAm. An equalizing transistor EQij (i is 0 or 1, j is 0, 1, 2 or 3) is disposed at an end of memory cell array MAm in the first direction.

Bit lines BL0, BL1, BL2, BL3, bBL0, bBL1, bBL2 and bBL3 extend in the first direction. Word lines WL00, . . . , WL0x, WL10, . . . , WL1x (x is a natural number not less than one) extend in the second direction. Gate equalizing lines GEQ and equalizing potential lines EQL extend in the second direction.

Figure 12B:
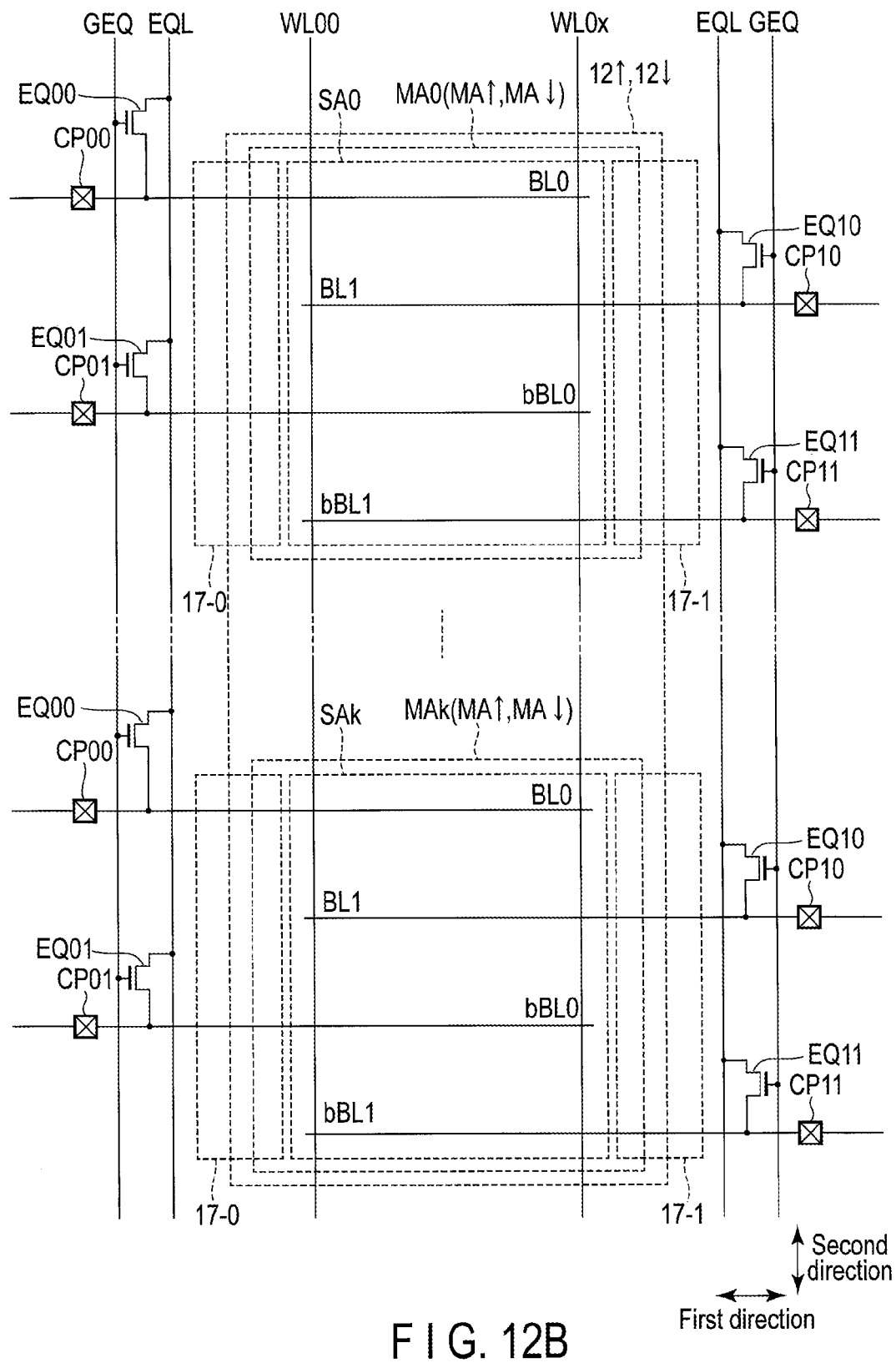

FIG. 12A and FIG. 12B show a second example of the layout of bit line pairs.

The second example is different from the first example in that bit lines BL0 and bBL0 are extended from a first end of memory cell array MAm (equalizing transistors EQ00 and EQ01 side) to a second end of memory cell array MAm (equalizing transistors EQ10 and EQ11 side), and bit lines BL1 and bBL1 are extended from the second end to the first end.

FIG. 12A corresponds to FIG. 11A and FIG. 12B corresponds to FIG. 11B. In the second example, however, bit line pairs BL2 and bBL2, and BL3 and bBL3 of the first example are omitted.

The second example is the same as the first example except the above points and thus the detailed description is omitted.

Figure 13A:
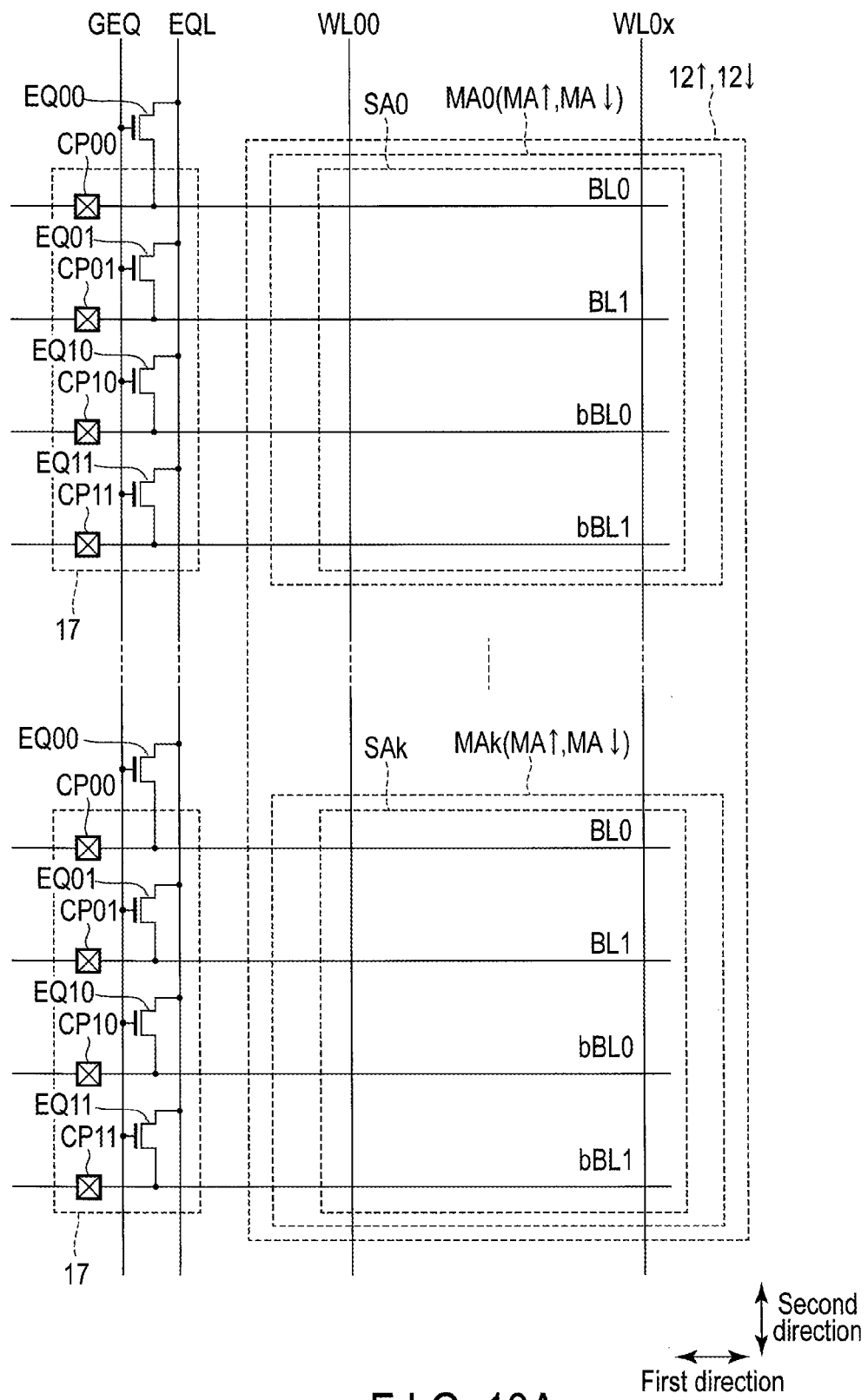
FIG. 13A and FIG. 13B are circuit diagrams showing a third example of the layout of the bit line pairs.
Figure 13B:
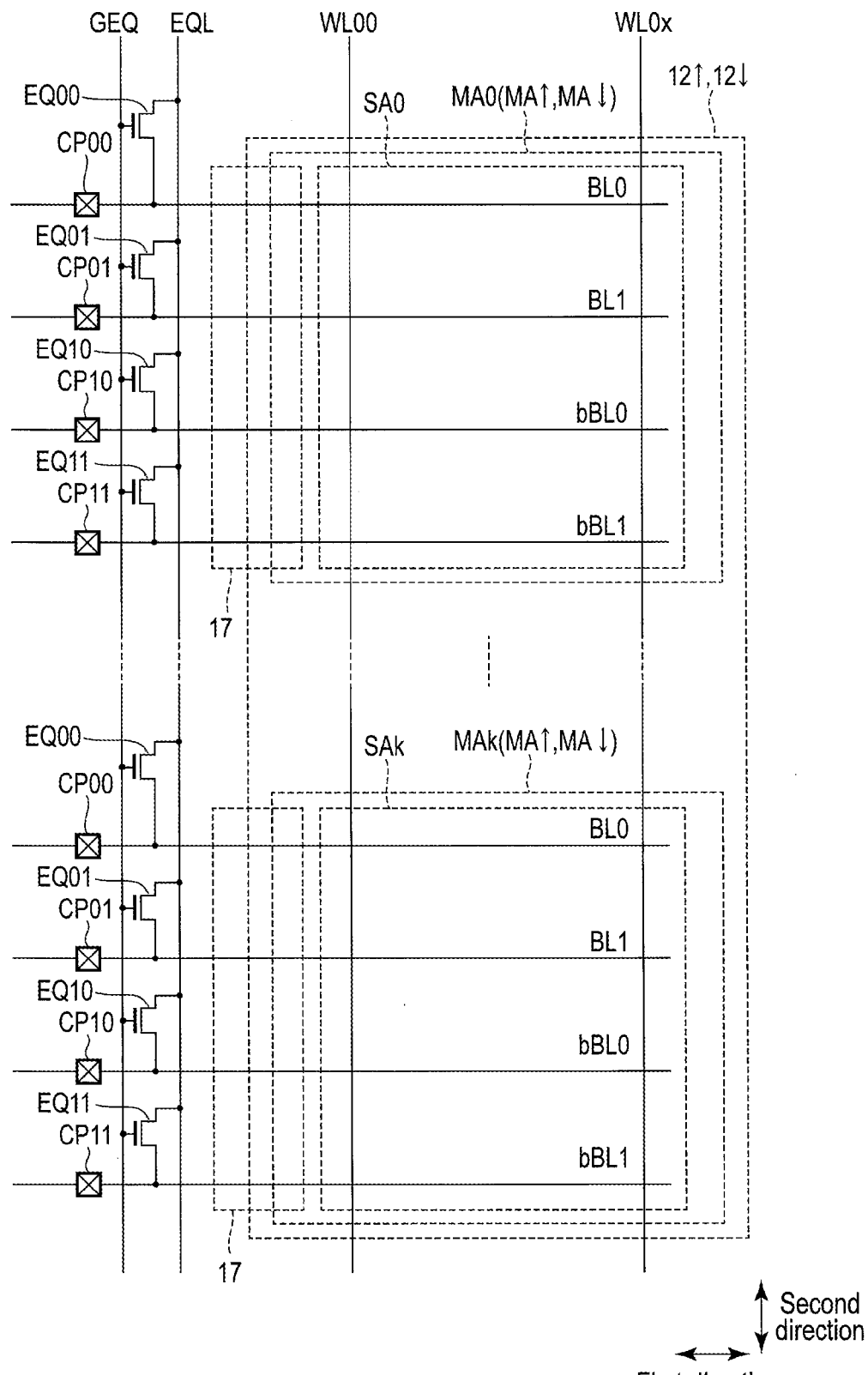

FIG. 13A and FIG. 13B show a third example of the layout of bit line pairs.

The third example is different from the second example in that selectors 17-0 and 17-1 are integrated into a selector 17 and disposed at the first end of memory cell array MAm, and equalizing transistors EQ00, EQ01, EQ10 and EQ11 are also disposed at the first end of memory cell array MAm.

FIG. 13A corresponds to FIG. 12A and FIG. 13B corresponds to FIG. 12B.

The third example is the same as the second example except the above points and thus the detailed description is omitted.

Figure 14B:
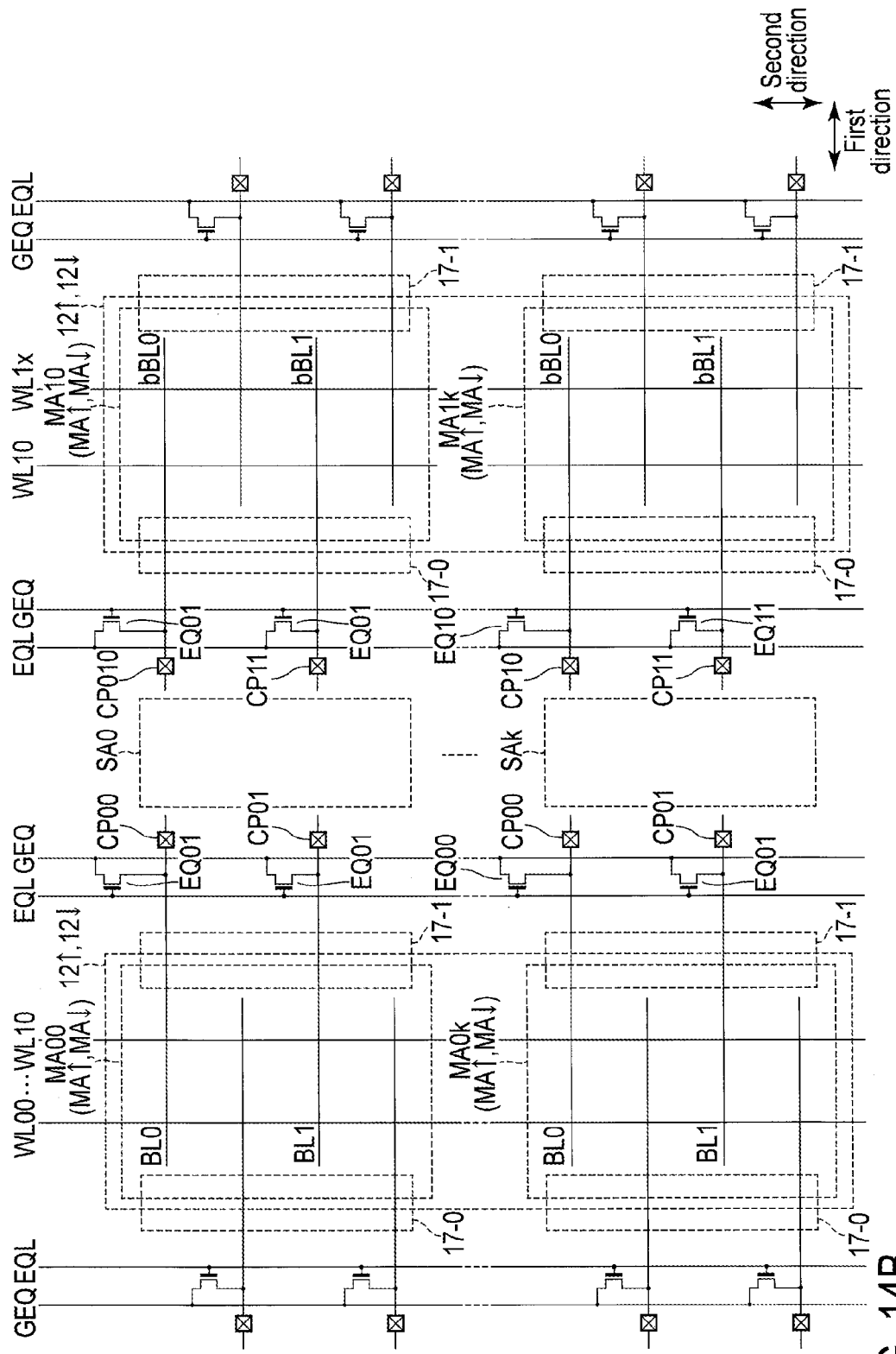

FIG. 14A and FIG. 14B show a fourth example of the layout of bit line pairs.

In the fourth example, sense amplifiers SAm (m is one of 0 to k) are disposed between memory cell arrays MA00, . . . , MA0k and memory cell arrays MA10, . . . , MA1k (k is a natural number not less than one).

Memory cell arrays MA00, . . . , MA0k, MA10, . . . , MA1k are disposed in an array in the first and second directions. Each of memory cell arrays MA0m and MA1m (m is one of 0 to k) comprises, for example, two memory cells $MA_\downarrow$ and $MA_\uparrow$ stacked on the semiconductor substrate.

For example, plate electrodes $12_\downarrow$ and $12_\uparrow$ can be shared by memory cell arrays MA00, . . . , MA0k. In the same manner, for example, plate electrodes $12_\downarrow$ and $12_\uparrow$ can be shared by memory cell arrays MA10, . . . , MA1k.

Sense amplifiers SAm are disposed between memory cell arrays MA00, . . . , MA0k and memory cell arrays MA10, . . . , MA1k. Selectors 17-0 and 17-1 are disposed near sense amplifiers SAm. Equalizing transistors EQij (i is 0 or 1, j is 0 or 1) are also disposed between memory cell arrays MA00, . . . , MA0k and memory cell arrays MA10, . . . , MA1k.

Bit lines BL0, BL1, bBL0 and bBL1 extend in the first direction. Word lines WL00, . . . , WL0x, WL10, . . . , WL1x (x is a natural number not less than one) extend in the second direction. Gate equalizing lines GEQ and equalizing potential lines EQL extend in the second direction.

CONCLUSION

According to each of the above embodiments, the three-dimensional DRAM can be implemented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a semiconductor substrate;
a sense amplifier on the semiconductor substrate;
a memory cell array including a memory cell above the sense amplifier, the memory cell including a capacitor and a first transistor, the capacitor including a first electrode and a second electrode, the first transistor including a first current path and a first control electrode controlling an on/off of the first current path, the first current path including a first terminal and a second terminal, the first terminal being electrically connected to the first electrode;
a first conductive line electrically connected to the second terminal and extending along an upper surface of the semiconductor substrate in a first direction, the first conductive line being electrically connected to the sense amplifier;
a second transistor including a second current path and a second control electrode controlling an on/off of the second current path, the second current path including a third terminal and a fourth terminal, and the third terminal being electrically connected to the first conductive line; and
a second conductive line electrically connected to the fourth terminal, wherein the second current path is provided between the first and second conductive lines, the second conductive line is electrically connected to a power source having a predetermined potential, and the first conductive line is set to the predetermined potential by turning on the second current path, wherein the second transistor is disposed above the sense amplifier and apart from the semiconductor substrate, and wherein the first current path comprises a first semiconductor layer, and the second current path comprises a second semiconductor layer.

2. The device of claim 1, wherein
the first and second semiconductor layers are oxide semiconductor layers.

3. The device of claim 2, wherein
each of the oxide semiconductor layers includes indium oxide, gallium oxide and zinc oxide.

4. The device of claim 1, wherein
the first and second semiconductor layers are semiconductor pillars.

5. The device of claim 1, further comprising:
a selector on the semiconductor substrate, the selector being electrically connected between the first conductive line and the sense amplifier.

6. The device of claim 1, wherein
the second electrode is a part of a plate electrode covering the memory cell array.

7. The device of claim 1, wherein
the second electrode is set to a fixed potential.

8. The device of claim 1, wherein
the first conductive line is set to the predetermined potential in a read operation.

9. The device of claim 1, wherein
the second conductive line extends along the upper surface of the semiconductor substrate in a second direction crossing the first direction.

10. The device of claim 1, wherein
the sense amplifier is disposed directly under the memory cell array.

11. The device of claim 1, wherein
the first current path comprises the first semiconductor layer between the capacitor and the first conductive line.

12. The device of claim 1, wherein
the first current path extends in a direction crossing the upper surface of the semiconductor substrate.

13. The device of claim 1, wherein
the second current path extends in a direction crossing the upper surface of the semiconductor substrate.

14. The device of claim 1, wherein
the second transistor is disposed side by side with the first transistor in the first direction.

15. The device of claim 1, wherein
the second current path extends along the upper surface of the semiconductor substrate.

16. The device of claim 1, wherein
the first transistor is disposed above the capacitor.

17. The device of claim 1, wherein
the capacitor is disposed above the first transistor.

* * * * *